(12) United States Patent
Yang et al.

(10) Patent No.: US 10,714,493 B2
(45) Date of Patent: Jul. 14, 2020

(54) SEMICONDUCTOR PLUG PROTECTED BY PROTECTIVE DIELECTRIC LAYER IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Haohao Yang, Wuhan (CN); Yong Zhang, Wuhan (CN); EnBo Wang, Wuhan (CN); Ruo Fang Zhang, Wuhan (CN); Fushan Zhang, Wuhan (CN); Qianbin Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 39 days.

(21) Appl. No.: 16/194,273

(22) Filed: Nov. 16, 2018

(65) Prior Publication Data
US 2020/0105781 A1    Apr. 2, 2020

Related U.S. Application Data

(63) Continuation of application No. PCT/CN2018/107790, filed on Sep. 27, 2018.

(51) Int. Cl.
*G11C 16/04*    (2006.01)
*H01L 27/11578*    (2017.01)
(Continued)

(52) U.S. Cl.
CPC .... *H01L 27/11578* (2013.01); *G11C 16/0483* (2013.01); *H01L 27/0688* (2013.01);
(Continued)

(58) Field of Classification Search
CPC ........... H01L 27/11578; H01L 27/0688; H01L 27/101; H01L 27/11551; H01L 27/11565; G11C 16/0483
See application file for complete search history.

(56) References Cited

U.S. PATENT DOCUMENTS 9,230,984 B1    1/2016    Takeguchi
9,728,551 B1    8/2017    Lu et al.
(Continued)

FOREIGN PATENT DOCUMENTS

CN    107810552 A    3/2018
CN    108630701 A    10/2018
(Continued)

OTHER PUBLICATIONS

International Search Report issued in corresponding International Application No. PCT/CN2018/107790, dated Jun. 28, 2019, 4 pages.
(Continued)

*Primary Examiner* — Mohammed A Bashar
(74) *Attorney, Agent, or Firm* — Bayes PLLC

(57) ABSTRACT

Embodiments of 3D memory devices with a semiconductor plug protected by a dielectric layer and methods for forming the same are disclosed. In an example, a 3D memory device includes a substrate, a memory stack including a plurality of interleaved conductor layers and dielectric layers on the substrate, and a memory string extending vertically through the memory stack. The memory string includes a semiconductor plug in a lower portion of the memory string, a protective dielectric layer on the semiconductor plug, and a memory film above the protective dielectric layer and along a sidewall of the memory string.

20 Claims, 14 Drawing Sheets

(51) Int. Cl.
    *H01L 27/06*     (2006.01)
    *H01L 27/10*     (2006.01)
    *H01L 27/11551*     (2017.01)
    *H01L 27/11565*     (2017.01)

(52) U.S. Cl.
    CPC ...... *H01L 27/101* (2013.01); *H01L 27/11551* (2013.01); *H01L 27/11565* (2013.01)

(56) References Cited

U.S. PATENT DOCUMENTS

| | | |
|---|---|---|
| 2016/0293621 A1 | 10/2016 | Huang et al. |
| 2018/0006049 A1 | 1/2018 | Inomata et al. |
| 2019/0067326 A1* | 2/2019 | Huang ................ H01L 29/1608 |

FOREIGN PATENT DOCUMENTS

| | | |
|---|---|---|
| TW | 201039476 A | 11/2010 |
| TW | 201131747 A | 9/2011 |
| TW | 201505180 A | 2/2015 |

OTHER PUBLICATIONS

Written Opinion of the International Searching Authority issued in corresponding International Application No. PCT/CN2018/107790, dated Jun. 28, 2019, 4 pages.

\* cited by examiner

SEMICONDUCTOR PLUG PROTECTED BY PROTECTIVE DIELECTRIC LAYER IN THREE-DIMENSIONAL MEMORY DEVICE AND METHOD FOR FORMING THE SAME

CROSS REFERENCE TO RELATED APPLICATION

This application is continuation of International Application No. PCT/CN2018/107790, filed on Sep. 27, 2018, entitled "SEMICONDUCTOR PLUG PROTECTED BY PROTECTIVE DIELECTRIC LAYER IN THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having a semiconductor plug protected by a protective dielectric layer and methods for forming the same are disclosed herein.

In one example, a 3D memory device includes a substrate, a memory stack including a plurality of interleaved conductor layers and dielectric layers on the substrate, and a memory string extending vertically through the memory stack. The memory string includes a semiconductor plug in a lower portion of the memory string, a protective dielectric layer on the semiconductor plug, and a memory film above the protective dielectric layer and along a sidewall of the memory string.

In another example, a method for forming a 3D memory device is disclosed. A first dielectric deck including a first plurality of interleaved sacrificial layers and dielectric layers is formed on a substrate. A first opening extending vertically through the first dielectric deck is formed. A semiconductor plug is formed in a lower portion of the first opening. A protective dielectric layer is formed on the semiconductor plug. A sacrificial layer is formed on the protective dielectric layer in the first opening. A second dielectric deck including a second plurality of interleaved sacrificial layers and dielectric layers is formed on the first dielectric deck. A second opening extending vertically through the second dielectric deck is formed to expose the sacrificial layer in the first opening. The sacrificial layer in the first opening is removed. A memory film is formed on the protective dielectric layer and along sidewall of the first and second openings. A third opening is formed through the memory film and the protective dielectric layer in the lower portion of the first opening. A semiconductor channel is formed over the memory film and in the third opening to contact the semiconductor plug.

In still another example, a method for forming a 3D memory device is disclosed. A first dielectric deck including a first plurality of interleaved sacrificial layers and dielectric layers is formed on a substrate. A first opening extending vertically through the first dielectric deck is formed. A semiconductor plug is epitaxially grown from the substrate in a lower portion of the first opening. A top portion of the semiconductor plug is oxidized to form a native oxide layer. A sacrificial layer is formed on the native oxide layer in the first opening. A second dielectric deck including a second plurality of interleaved sacrificial layers and dielectric layers is formed on the first dielectric deck. A second opening extending vertically through the second dielectric deck is formed to expose the sacrificial layer in the first opening. The sacrificial layer is etched until being stopped by the native oxide layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
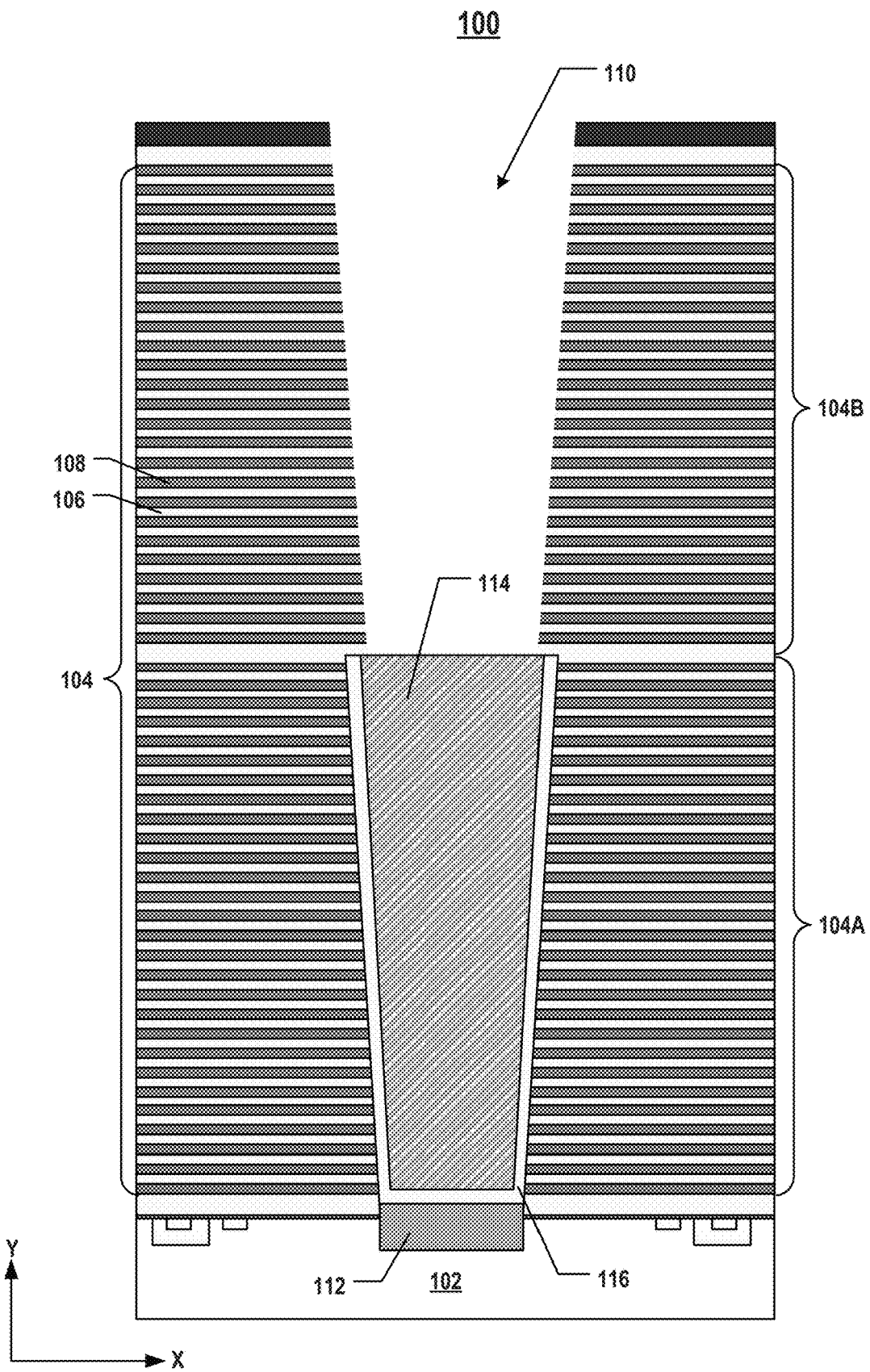
FIG. 1 illustrates a cross-section of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a NAND memory string. The semiconductor plug acts as a channel of a transistor when combined with a gate conductor layer formed surrounding it. In fabricating 3D NAND memory devices with advanced technologies, such as having 96 or more levels, a dual-deck architecture is usually used, which requires removal of a sacrificial layer (e.g., polysilicon) that fills the lower channel hole in the lower deck above the semiconductor plug.

For example, FIG. 1 illustrates a cross-section of an exemplary 3D memory device 100 at a fabrication stage for forming a NAND memory string extending vertically through a dual-deck dielectric stack 104 (including a lower dielectric deck 104A and an upper dielectric deck 104B). Each of lower and upper dielectric decks 104A and 104B can include a plurality of pairs each including a dielectric layer 106 and a sacrificial layer 108 (referred to herein as "dielectric layer pairs") formed above a substrate 102. Once all the fabrication processes are finished, dielectric stack 104 is replaced with a memory stack by a gate replacement process, which replaces each sacrificial layer 108 with a conductor layer. An upper channel hole 110 and a lower channel hole (filled with a sacrificial layer 114 in FIG. 1) can be formed through upper dielectric deck 104B and lower dielectric deck 104A, respectively, in which the NAND memory string can be formed. As shown in FIG. 1, 3D memory device 100 can include a semiconductor plug 112 at the lower end of the lower channel hole. In some embodiments, semiconductor plug 112 extends into part of substrate 102, i.e., below the top surface of substrate 102.

Sacrificial layer 114 can be formed to partially or fully fill the lower channel hole through lower dielectric deck 104A. In other words, sacrificial layer 114 can be formed above semiconductor plug 112 in the lower channel hole. When etching sacrificial layer 114 in the later process, semiconductor plug 112 underneath needs to be protected from the damages caused by the chemical etchants, which is usually done by a liner oxide layer 116 deposited along the sidewall and bottom surface of the lower channel hole using atomic layer deposition (ALD) process.

Liner oxide layer 116 also needs to be removed post sacrificial layer removal during the fabrication processes for 3D memory device 100, which, however, can cause various process issues. For example, the etching of liner oxide layer 116 can enlarge the critical dimension of the channel holes, in particular, upper channel hole 110. Also, the etching of liner oxide layer 116 has a high risk for dielectric layer 106 (e.g., made from silicon oxide) recess control in lower dielectric deck 104A. Moreover, the relatively expensive ALD process for forming liner oxide layer 116 and the additional etching process for removing liner oxide layer 116 can increase the process cost.

Various embodiments in accordance with the present disclosure provide a cost-effective structure and method for protecting the semiconductor plug of a 3D memory device from etching of sacrificial layer by forming a protective dielectric layer. In some embodiments, a native oxide layer of the semiconductor plug, instead of an ALD liner oxide layer, is used to protect the semiconductor plug underneath. Compared with the ALD process, processes for forming a native oxide layer, such as thermal oxidation or wet chemical oxidation, are less expensive. Moreover, since the native oxide layer does not need to be removed during the fabrication process, the process becomes more cost-effective, and the issues of enlarging the critical dimension of the channel hole and difficulty in oxide recess control can be addressed.

Figure 2:
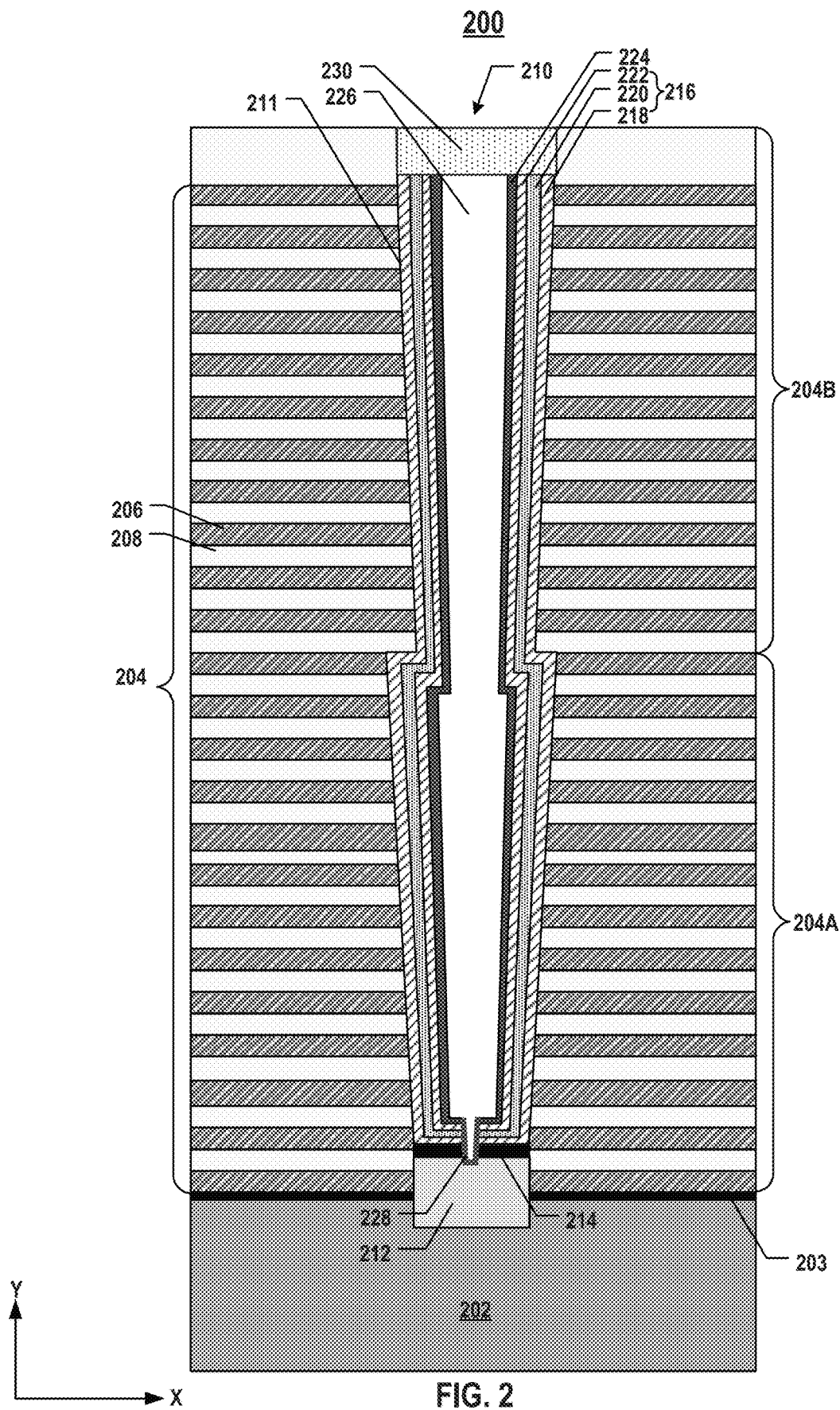
FIG. 2 illustrates a cross-section of an exemplary 3D memory device having a semiconductor plug protected by a protective dielectric layer, according to some embodiments of the present disclosure.

FIG. 2 illustrates a cross-section of an exemplary 3D memory device 200 having a semiconductor plug 212 protected by a protective dielectric layer 214, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. It is noted that x and y axes are included in FIG. 2 to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in the y-direction (i.e., the vertical direction) when the substrate is positioned in the lowest plane of the 3D memory device in the y-direction. The same notion for describing spatial relationship is applied throughout the present disclosure.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of array of NAND memory strings 210 extending vertically above substrate 202. The memory array device can include NAND memory strings 210 that extend through a plurality of pairs each including a conductor layer 206 and a dielectric layer 208 (referred to herein as "conductor/dielectric layer pairs"). The stacked conductor/dielectric layer pairs are also referred to herein as a "memory stack" 204. In some embodiments, an insulation layer 203, such as a silicon oxide layer, is formed between substrate 202 and memory stack 204. The number of the conductor/dielectric layer pairs in memory stack 204 (e.g., 32, 64, 96, or 128) determines the number of memory cells in 3D memory device 200. Memory stack 204 can include a plurality of interleaved conductor layers 206 and dielectric layers 208. Conductor layers 206 and dielectric layers 208 in memory stack 204 can alternate in the vertical direction. Conductor layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof. In some embodiments, memory stack 204 has a dual-deck architecture, which includes a lower memory deck 204A and an upper memory deck 204B on lower memory deck 204A. The numbers of conductor/dielectric layer pairs in each of lower and upper memory decks 204A and 204B can be the same or different.

As shown in FIG. 2, NAND memory string 210 can include a channel structure 211 extending vertically through memory stack 204. Channel structure 211 can include a channel hole filled with semiconductor material(s) (e.g., as a semiconductor channel 224) and dielectric material(s) (e.g., as a memory film 216). In some embodiments, semiconductor channel 224 includes silicon, such as amorphous silicon, polysilicon, or single crystalline silicon. In some embodiments, memory film 216 is a composite layer including a tunneling layer 222, a storage layer 220 (also known as a "charge trap layer"), and a blocking layer 218. The remaining space of channel structure 211 can be partially or fully filled with a filling layer 226 including dielectric materials, such as silicon oxide. Channel structure 211 can have a cylinder shape (e.g., a pillar shape). Filling layer 226, semiconductor channel 224, tunneling layer 222, storage layer 220, and blocking layer 218 are arranged radially from the center toward the outer surface of the pillar in this order, according to some embodiments. Tunneling layer 222 can include silicon oxide, silicon oxynitride, or any combination thereof. Storage layer 220 can include silicon nitride, silicon oxynitride, silicon, or any combination thereof. Blocking layer 218 can include silicon oxide, silicon oxynitride, high dielectric constant (high-k) dielectrics, or any combination thereof. In one example, memory film 216 can include a composite layer of silicon oxide/silicon oxynitride/silicon oxide (ONO).

In some embodiments, conductor layer 206 (each being part of a word line) in memory stack 204 functions as a gate conductor of memory cells in NAND memory string 210. Conductor layer 206 can include multiple control gates of multiple NAND memory cells and can extend laterally as a word line ending at the edge of memory stack 204 (e.g., in a staircase structure of memory stack 204). In some embodiments, memory cell transistors in NAND memory string 210 include gate conductors (i.e., parts of conductor layers 206 that abut channel structure 211) made from W, adhesion layers (not shown) including titanium/titanium nitride (Ti/TiN) or tantalum/tantalum nitride (Ta/TaN), gate dielectric layers (not shown) made from high-k dielectric materials, and channel structure 211 including polysilicon.

In some embodiments, NAND memory string 210 further includes semiconductor plug 212 in a lower portion (e.g., at the lower end) of NAND memory string 210. As used herein, the "upper end" of a component (e.g., NAND memory string 210) is the end farther away from substrate 202 in the y-direction, and the "lower end" of the component (e.g., NAND memory string 210) is the end closer to substrate 202 in the y-direction when substrate 202 is positioned in the lowest plane of 3D memory device 200. Semiconductor plug 212 can include a semiconductor material, such as silicon, which is epitaxially grown from substrate 202 in any suitable directions. It is understood that in some embodiments, semiconductor plug 212 includes single crystalline silicon, the same material of substrate 202. In other words, semiconductor plug 212 can include an epitaxially-grown semiconductor layer that is the same as the material of substrate 202. Semiconductor plug 212 can function as a channel controlled by a source select gate of NAND memory string 210.

In some embodiments, NAND memory string 210 further includes a channel plug 230 in an upper portion (e.g., at the upper end) of NAND memory string 210. Channel plug 230 can be in contact with the upper end of semiconductor channel 224. Channel plug 230 can include semiconductor materials (e.g., polysilicon) or conductive materials (e.g., metals). In some embodiments, channel plug 230 includes an opening filled with Ti/TiN or Ta/TaN as an adhesion layer and tungsten as a conductor. By covering the upper end of channel structure 211 during the fabrication of 3D memory device 200, channel plug 230 can function as an etch stop layer to prevent etching of dielectrics filled in channel structure 211, such as silicon oxide and silicon nitride. In some embodiments, channel plug 230 also functions as the drain of NAND memory string 210.

Different from FIG. 1 in which semiconductor plug 112 is protected by liner oxide layer 116 formed on semiconductor plug 112 as well as along the sidewall of the NAND memory string (e.g., the lower channel hole), as shown in FIG. 2, semiconductor plug 212 is protected by protective dielectric layer 214 formed on semiconductor plug 212, but not along the sidewall of NAND memory string 210, according to some embodiments. In some embodiments, instead of using the relatively expensive ALD process to achieve a conformal thin film (e.g., as liner oxide layer 116) with good coverage on both the sidewall and the bottom surface of the channel hole, protective dielectric layer 214 can be formed using any suitable non-ALD processes including, but not limited to, physical vapor deposition (PVD), chemical vapor deposition (CVD), electroplating, electroless plating, or any combinations thereof, which are less expensive compared with the ALD process. Moreover, protective dielectric layer 214 can remain in the final product of 3D memory device 200, as opposed to being removed from the final product, like liner oxide layer 116. That is, in some embodiments, the fabrication processes for 3D memory device 200 do not include an etching step for removing protective dielectric layer 214 after the sacrificial layer filling the channel hole of NAND memory string 210 being removed. As a result, the various issues caused by the removal of liner oxide layer 116 as described above for fabricating 3D memory device 100 can be avoided.

As shown in FIG. 2, protective dielectric layer 214 is not formed along the sidewall of NAND memory string 210, according to some embodiments. Protective dielectric layer 214 can cover substantially the entire top surface of semiconductor plug 212, e.g., only leaving an opening for forming a semiconductor contact 228 for electrically connecting semiconductor channel 224 of channel structure 211 to semiconductor plug 212. That is, protective dielectric layer 214 can be disposed vertically between channel structure 211 and semiconductor plug 212 in NAND memory string 210. Memory film 216 (and tunneling layer 222, storage layer 220, and blocking layer 218 therein) can be thus disposed above protective dielectric layer 214 and along the sidewall of NAND memory string 210. In some embodiments, semiconductor channel 224 extends through the opening in protective dielectric layer 214 to contact semiconductor plug 212 underneath. Semiconductor channel 224 and semiconductor contact 228 can include the same semiconductor materials, such as polysilicon. In some embodiments, semiconductor channel 224 and semiconductor contact 228 each includes polysilicon, and semiconductor plug 212 includes single crystalline silicon. Besides the area of semiconductor contact 228, protective dielectric layer 214 can be formed on the entire top surface of semiconductor plug 212 and abut the sidewall of NAND memory string 210 to protect semiconductor plug 212 and substrate 202 underneath from, for example, the damages caused by the chemical etchants used in the sacrificial removal process.

The thickness of protective dielectric layer 214 can be between about 1 nm and about 5 nm, such as between 1 nm and 5 nm, (e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, the thickness of protective dielectric layer 214 is about 3 nm, such as 3 nm. The thickness of dielectric layer 214 can be determined by balancing two factors: (1) whether it is sufficient thick to protect underneath semiconductor plug 212 and substrate 202 in later fabrication processes, and (2) whether it is too thick to introduce excess etching load when etching the opening for semiconductor contact 228. In some embodiments, protective dielectric layer 214 is a composite layer that includes multiple dielectric layers stacked vertically with a combined thickness in the range described above.

Protective dielectric layer 214 can include dielectric materials, such as silicon oxide, silicon nitride, silicon oxynitride, high-k dielectrics, or any combination thereof. In some embodiments, protective dielectric layer 214 is a native oxide layer of semiconductor plug 212. In other words, the top portion of semiconductor plug 212 can be oxidized to form a native oxide layer as protective dielectric layer 214 for protecting the remaining portion of semiconductor plug 212 underneath. As described below in detail, the native oxide layer can be formed in any suitable manners, such as by thermal oxidation or wet chemical oxidation (e.g., using chemicals containing ozone). The native oxide layer can be a silicon oxide layer when semiconductor plug 212 includes silicon. It is understood that in some embodiments, protective dielectric layer 214 is not the native oxide layer of semiconductor plug 212, but rather being deposited on the top surface of semiconductor plug 212. For example, semiconductor plug 212 includes silicon, and protective dielectric layer 214 can include any dielectric materials besides silicon oxide.

Figure 3A:
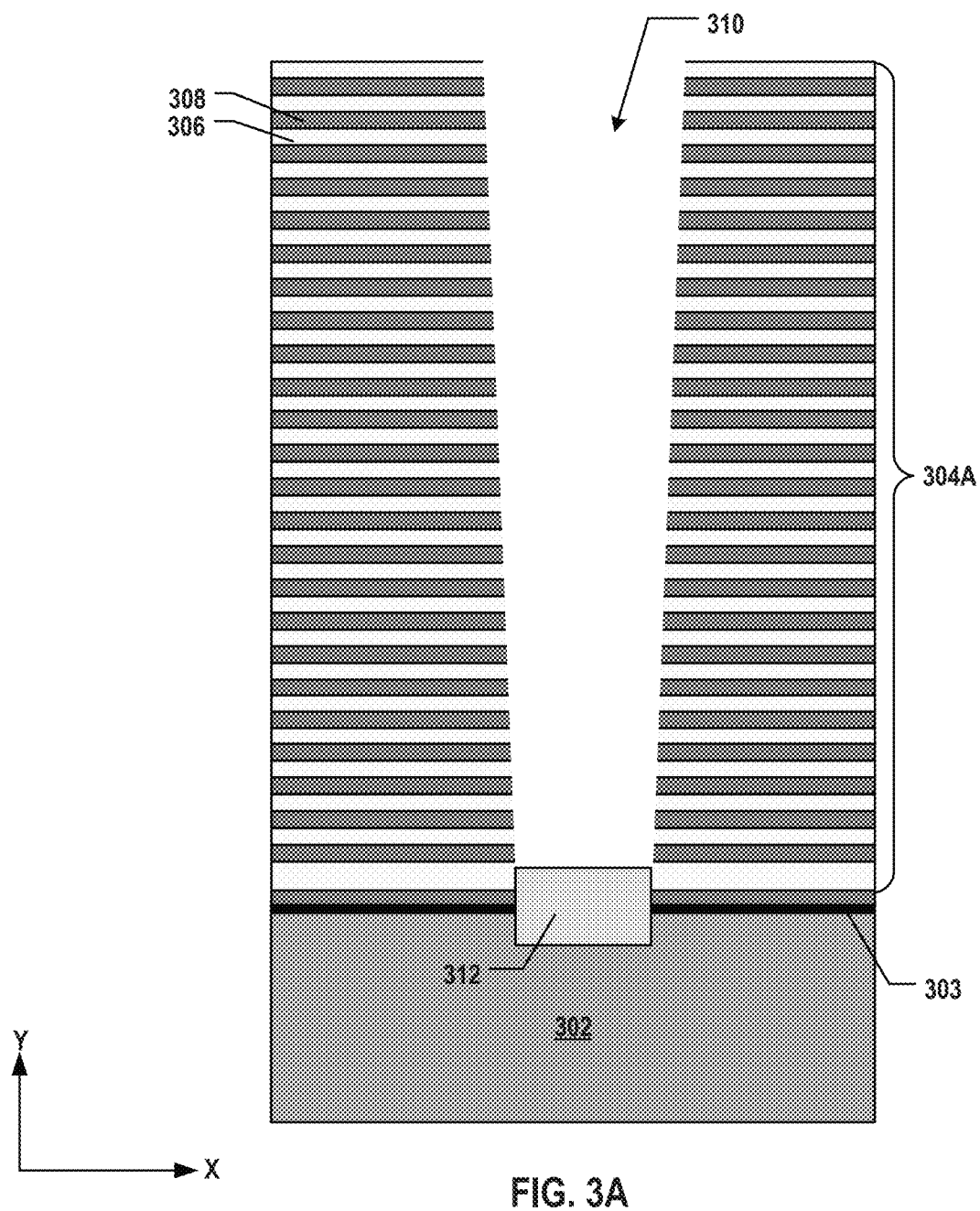
FIGS. 3A-3J illustrate an exemplary fabrication process for forming a 3D memory device having a semiconductor plug protected by a protective dielectric layer, according to some embodiments of the present disclosure.

FIGS. 3A-3J illustrate an exemplary fabrication process for forming a 3D memory device having a semiconductor plug protected by a protective dielectric layer, according to some embodiments of the present disclosure. FIGS. 4A-4B illustrate a flowchart of an exemplary method 400 for forming a 3D memory device having a semiconductor plug protected by a protective dielectric layer, according to some embodiments of the present disclosure. Examples of the 3D memory device depicted in FIGS. 3A-3J and 4A-4B include 3D memory device 200 depicted in FIG. 2. FIGS. 3A-3J and 4A-4B will be described together. It is understood that the operations shown in method 400 are not exhaustive and that other operations can be performed as well before, after, or between any of the illustrated operations. Further, some of the operations may be performed simultaneously, or in a different order than shown in FIGS. 4A-4B.

Referring to FIG. 4A, method 400 starts at operation 402, in which a first dielectric deck is formed on a substrate. The substrate can be a silicon substrate. The first dielectric deck can include a first plurality of interleaved sacrificial layers and dielectric layers. Referring to FIG. 3A, a lower dielectric deck 304A including a plurality pairs of a first dielectric layer 306 and a second dielectric layer (known as a "sacrificial layer") 308 (together referred to herein as "dielectric layer pairs") is formed on a silicon substrate 302. In some embodiments, an insulation layer 303 is formed between lower dielectric deck 304A and silicon substrate 302 by depositing dielectric materials, such as silicon oxide, or thermal oxidation, on silicon substrate 302 prior to the formation of lower dielectric deck 304A. Lower dielectric deck 304A includes interleaved sacrificial layers 308 and dielectric layers 306, according to some embodiments. Dielectric layers 306 and sacrificial layers 308 can be alternatingly deposited on silicon substrate 302 to form lower dielectric deck 304A. In some embodiments, each dielectric layer 306 includes a layer of silicon oxide, and each sacrificial layer 308 includes a layer of silicon nitride. Lower dielectric deck 304A can be formed by one or more thin film deposition processes including, but not limited to, CVD, PVD, ALD, or any combination thereof.

Method 400 proceeds to operation 404, as illustrated in FIG. 4A, in which a first opening extending vertically through the first dielectric deck is formed. As illustrated in FIG. 3A, a lower channel hole 310 is an opening formed extending vertically through lower dielectric deck 304A. In some embodiments, a plurality of openings are formed through lower dielectric deck 304A such that each opening becomes the location for growing an individual NAND memory string in the later process. In some embodiments, fabrication processes for forming lower channel hole 310 include wet etching and/or dry etching, such as deep-ion reactive etching (DRIE). In some embodiments, lower channel hole 310 extends further through the top portion of silicon substrate 302. The etching process through lower dielectric deck 304A may not stop at the top surface of silicon substrate 302 and may continue to etch part of silicon substrate 302. In some embodiments, a separate etching process is used to etch part of silicon substrate 302 after etching through lower dielectric deck 304A.

Method 400 proceeds to operation 406, as illustrated in FIG. 4A, in which a semiconductor plug is formed in the lower portion of the first opening. The semiconductor plug can be epitaxially grown from the substrate in the lower portion of the first opening. In some embodiments, the semiconductor plug is an epitaxially-grown silicon plug. As illustrated in FIG. 3A, a silicon plug 312 can be formed by filling the lower portion of lower channel hole 310 with single crystalline silicon epitaxially grown from silicon substrate 302 in any suitable directions (e.g., from bottom surface and/or side surface). The fabrication processes for epitaxially growing silicon plug 312 can include, but not limited to, vapor-phase epitaxy (VPE), liquid-phase epitaxy (LPE), molecular-beam epitaxy (MPE), or any combinations thereof.

Method 400 proceeds to operation 408, as illustrated in FIG. 4A, in which a protective dielectric layer is formed on the semiconductor plug to protect the semiconductor plug. A top portion of the semiconductor plug can be oxidized to form a native oxide layer as the protective dielectric layer. The native oxide layer can be formed by thermal oxidation or wet chemical oxidation. In some embodiments, the thickness of the protective dielectric layer is between 1 nm and 5 nm. The protective dielectric layer is not formed along the sidewall of the first opening, according to some embodiments. In some embodiments, the protective dielectric layer is formed to completely cover the semiconductor plug.

Figure 3B:
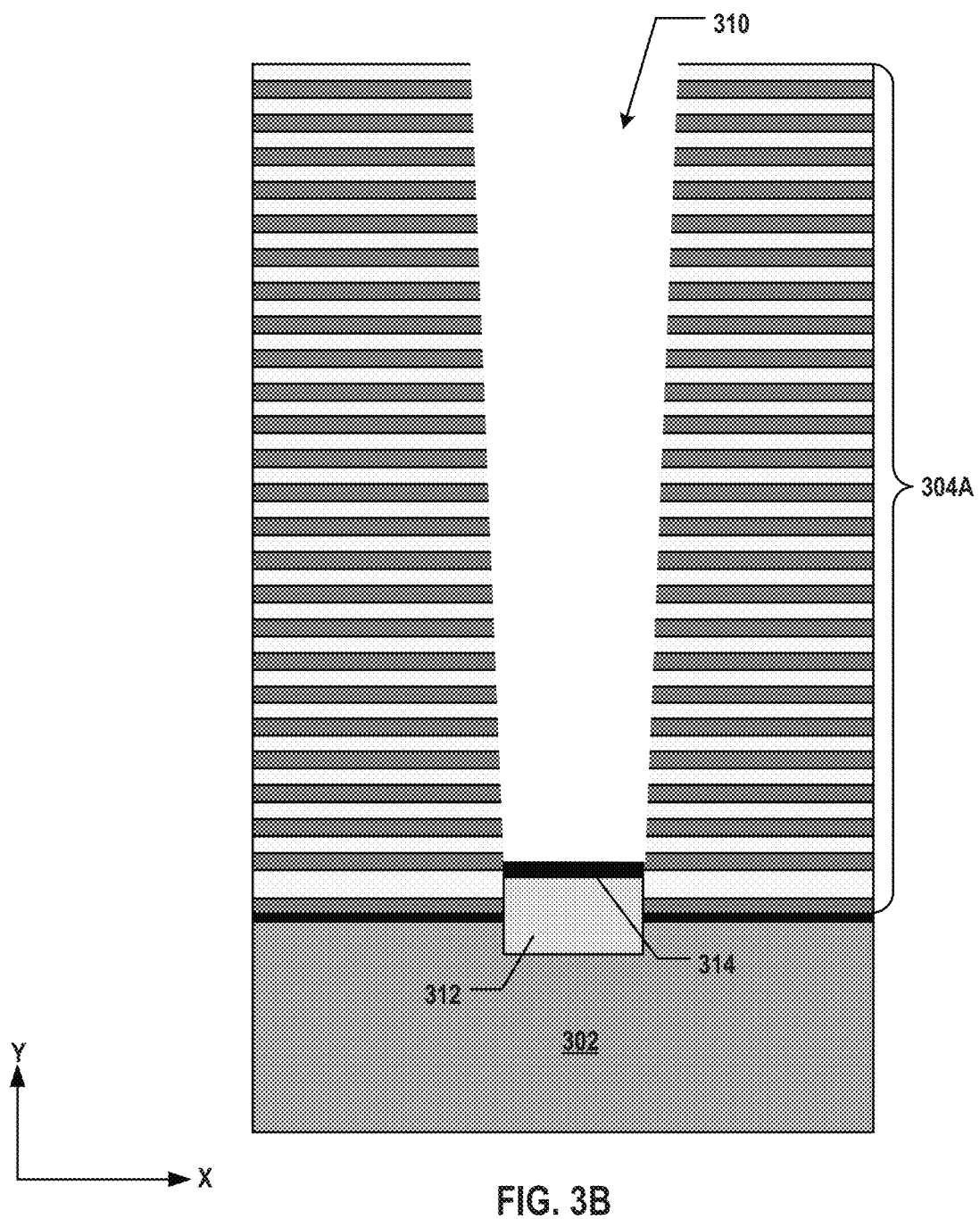
Figure 4A:
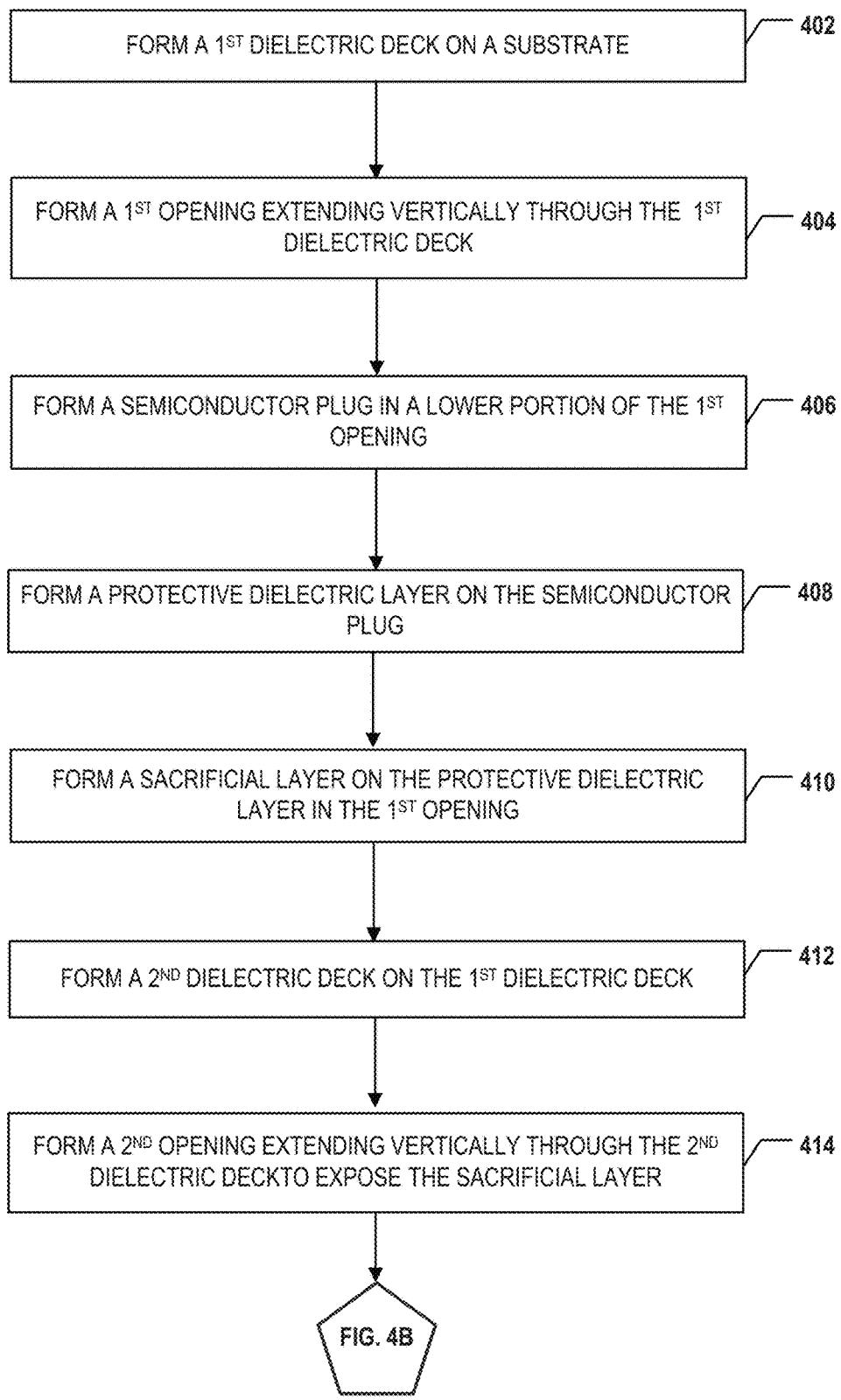
FIGS. 4A-4B illustrate a flowchart of an exemplary method for forming a 3D memory device having a semiconductor plug protected by a protective dielectric layer, according to some embodiments of the present disclosure.
Figure 4B:
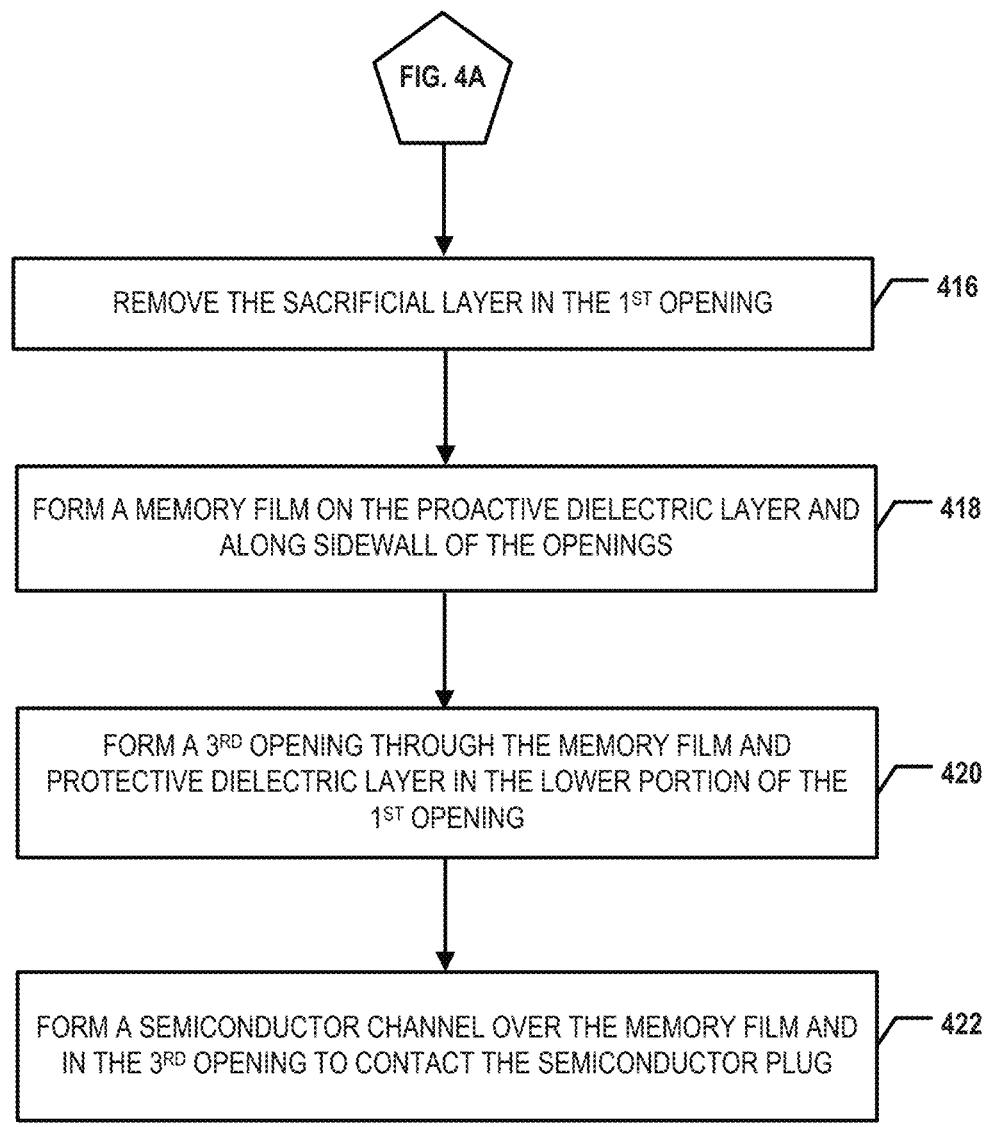

As illustrated in FIG. 3B, a protective dielectric layer 314 is formed on silicon plug 312 to completely cover silicon plug 312. In some embodiments, protective dielectric layer 314 is not formed along the sidewall of lower channel hole 310. The thickness of protective dielectric layer 314 can be between about 1 nm and about 5 nm, such as between 1 nm and 5 nm, (e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, the thickness of protective dielectric layer 314 is about 3 nm, such as 3 nm.

Protective dielectric layer 314 can be a native oxide layer of silicon plug 312 formed by oxidizing the top portion of silicon plug 312 with the thickness in the ranges described above. In some embodiments, the top portion of silicon plug 312 is oxidized by a thermal oxidation process. Either dry oxidation using molecular oxygen as the oxidant or wet oxidation using water vapor as the oxidant can be used to form the native oxide layer at a temperature between, for example, about 700° C. and about 1,200° C. As thermal oxide incorporates silicon consumed from silicon plug 312 and oxygen supplied from the ambient, the native oxide layer can grow both down into silicon plug 312 and up out of silicon plug 312, resulting in part of the native oxide layer thickness lying below the original top surface of silicon plug 312, and part above it. The thickness of the resulting native oxide layer can be controlled by the thermal oxidation temperature and/or time.

In some embodiments, the top portion of silicon plug 312 is oxidized by a wet chemical oxidation process. Wet chemicals including ozone can be used to oxidize part of silicon plug 312 to form a native oxide layer. In some embodiments, the wet chemical is a mixture of hydrofluoric acid and ozone (e.g., FOM). For example, the hydrofluoric acid has a concentration of 49% in the ultra-pure water. The thickness of the resulting native oxide layer can be controlled by the wet chemical compositions, temperature, and/or time.

It is understood that in some embodiments, protective dielectric layer 314 is formed by depositing one or more layers of dielectric materials on silicon plug 312 using one or more thin film deposition processes, such as PVD, CVD, electroplating, electroless plating, or any combinations thereof, which are less expensive compared with the ALD process. In some embodiments, the deposition process for forming protective dielectric layer 314 is highly directional (e.g., guided using magnetic field) toward the bottom of lower channel hole 310 to avoid deposition on the sidewall of lower channel hole 310. In some embodiments, protective dielectric layer 314 is deposited using directional ALD process to cover the top surface of silicon plug 312, but not the sidewall of lower channel hole 310.

Figure 3C:
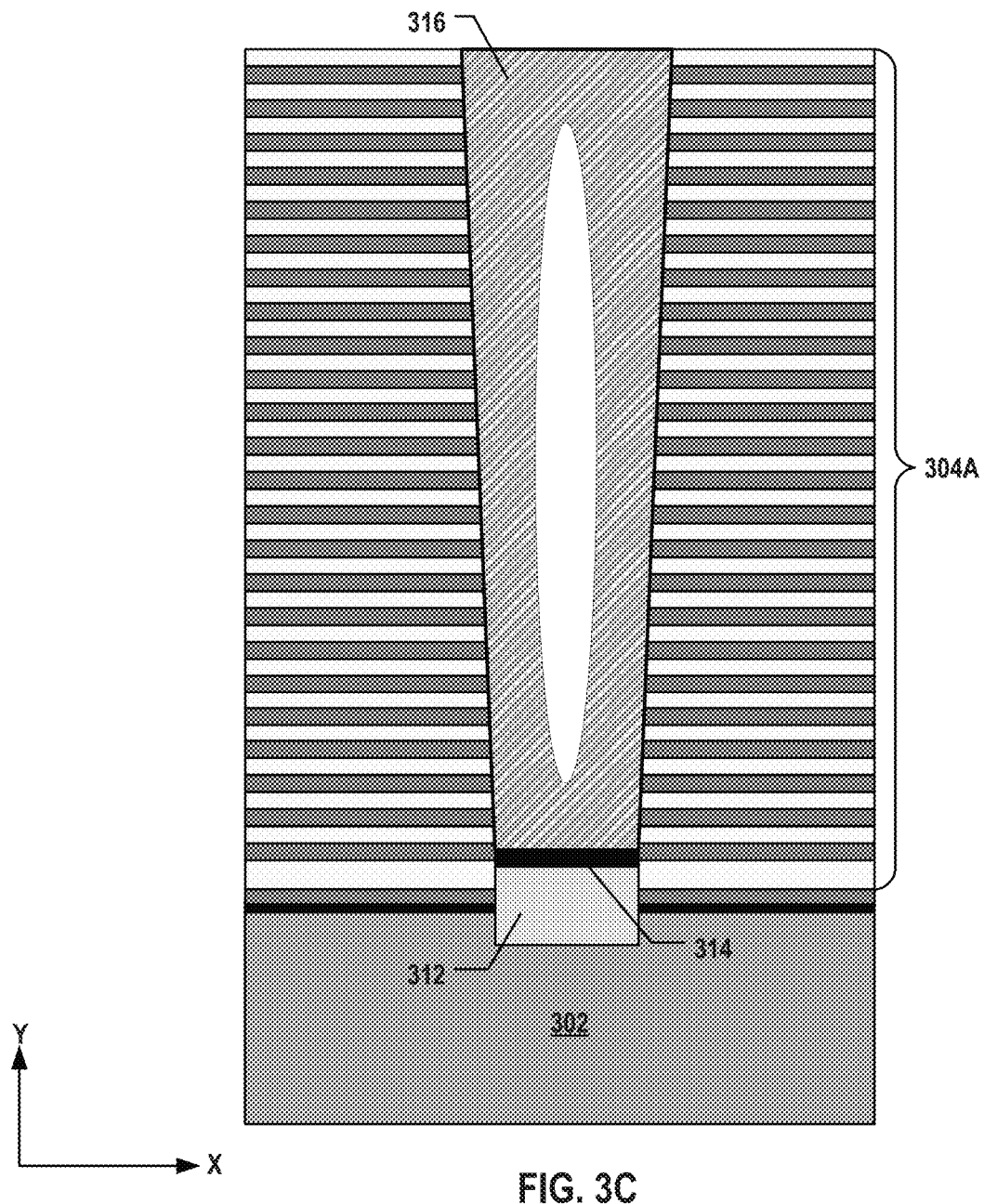

Method 400 proceeds to operation 410, as illustrated in FIG. 4A, in which a sacrificial layer is formed on the protective dielectric layer in the first opening. As illustrated in FIG. 3C, a sacrificial layer 316 is deposited using one or more thin film deposition processes, such as PVD, CVD, ALD, electroplating, electroless plating, or any combinations thereof, to partially or fully fill lower channel hole 310 (shown in FIG. 3B). Sacrificial layer 316 can include any suitable material that is to be removed in a later process, such as polysilicon. To avoid removing protective dielectric layer 314 together with sacrificial layer 316, sacrificial layer 316 and protective dielectric layer 314 include different materials, according to some embodiments.

Figure 3D:
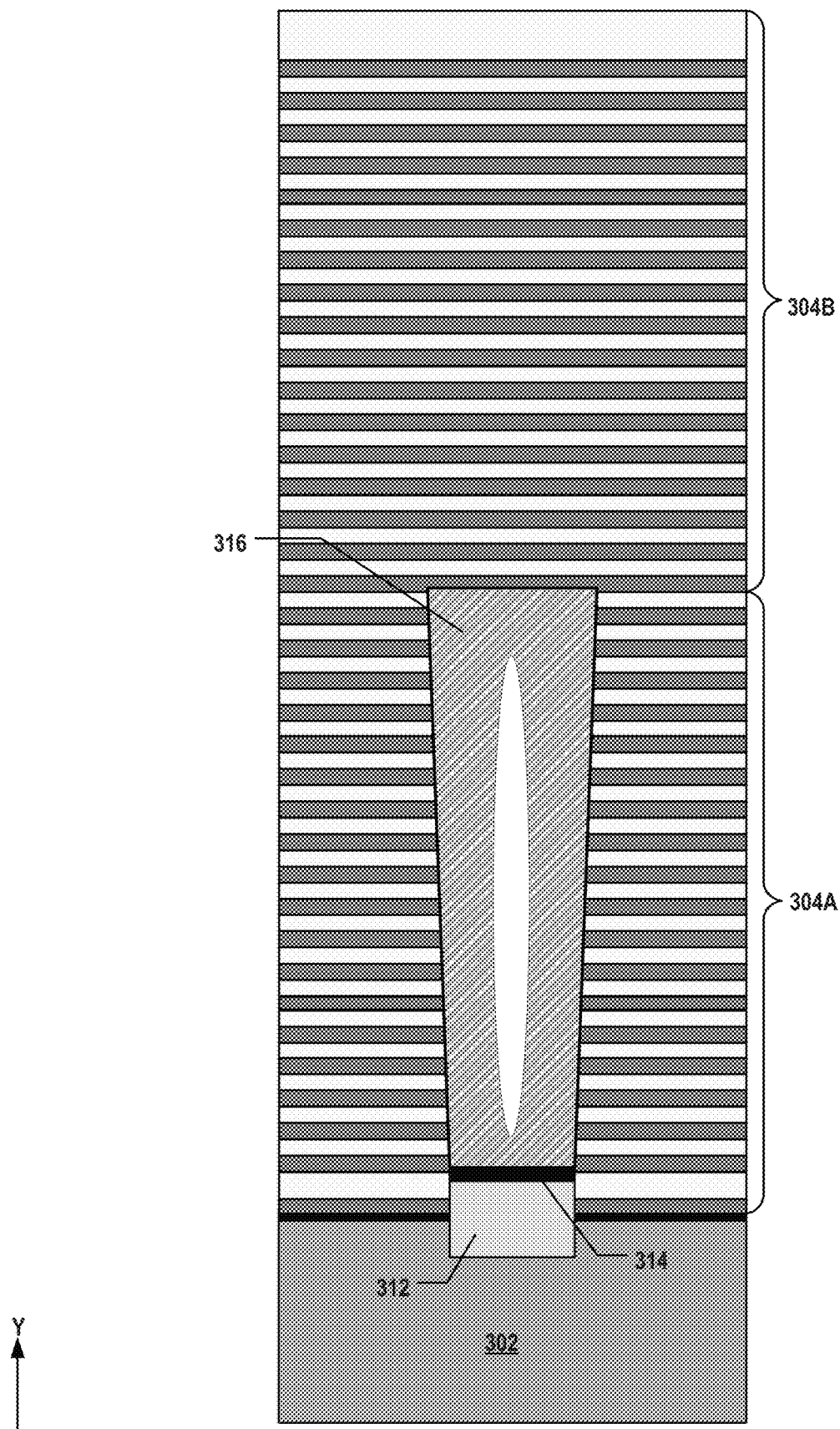

Method 400 proceeds to operation 412, as illustrated in FIG. 4A, in which a second dielectric deck is formed on the first dielectric deck. Similar to the first dielectric deck, the second dielectric deck can include a second plurality of interleaved sacrificial layers and dielectric layers. Referring to FIG. 3D, an upper dielectric deck 304B including a plurality of dielectric layer pairs is formed on lower dielectric deck 304A. Upper dielectric deck 304B can be formed by one or more thin film deposition processes including, but not limited to, CVD, PVD, ALD, or any combination thereof.

Figure 3E:
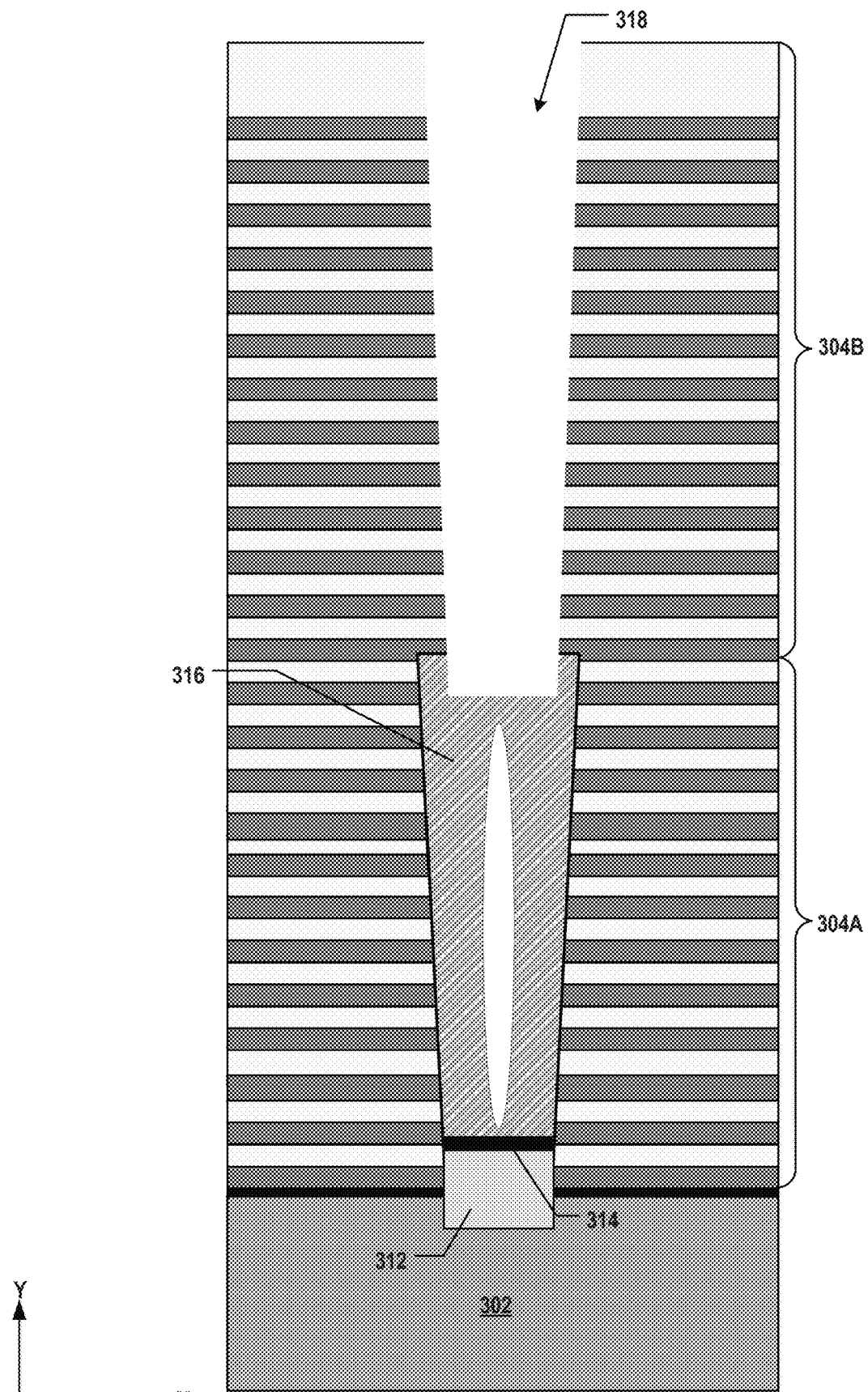

Method 400 proceeds to operation 414, as illustrated in FIG. 4A, in which a second opening extending vertically through the second dielectric deck is formed to expose the sacrificial layer. As illustrated in FIG. 3E, an upper channel hole 318 is another opening formed extending vertically through upper dielectric deck 304B to expose sacrificial layer 316. Upper channel hole 318 can be aligned with lower channel hole 310 (shown in FIG. 3F) so as to expose at least part of sacrificial layer 316. Upper and lower channels 318 and 310 can be connected after sacrificial layer 316 is removed. In some embodiments, fabrication processes for forming upper channel hole 318 include wet etching and/or dry etching, such as DRIE. In some embodiments, upper channel hole 318 extends into part of sacrificial layer 316. The etching process through upper dielectric deck 304B may not stop at the top surface of sacrificial layer 316 and continue to etch part of sacrificial layer 316. In some embodiments, a separate etching process is used to etch part of sacrificial layer 316 after etching upper dielectric deck 304B.

Figure 3F:
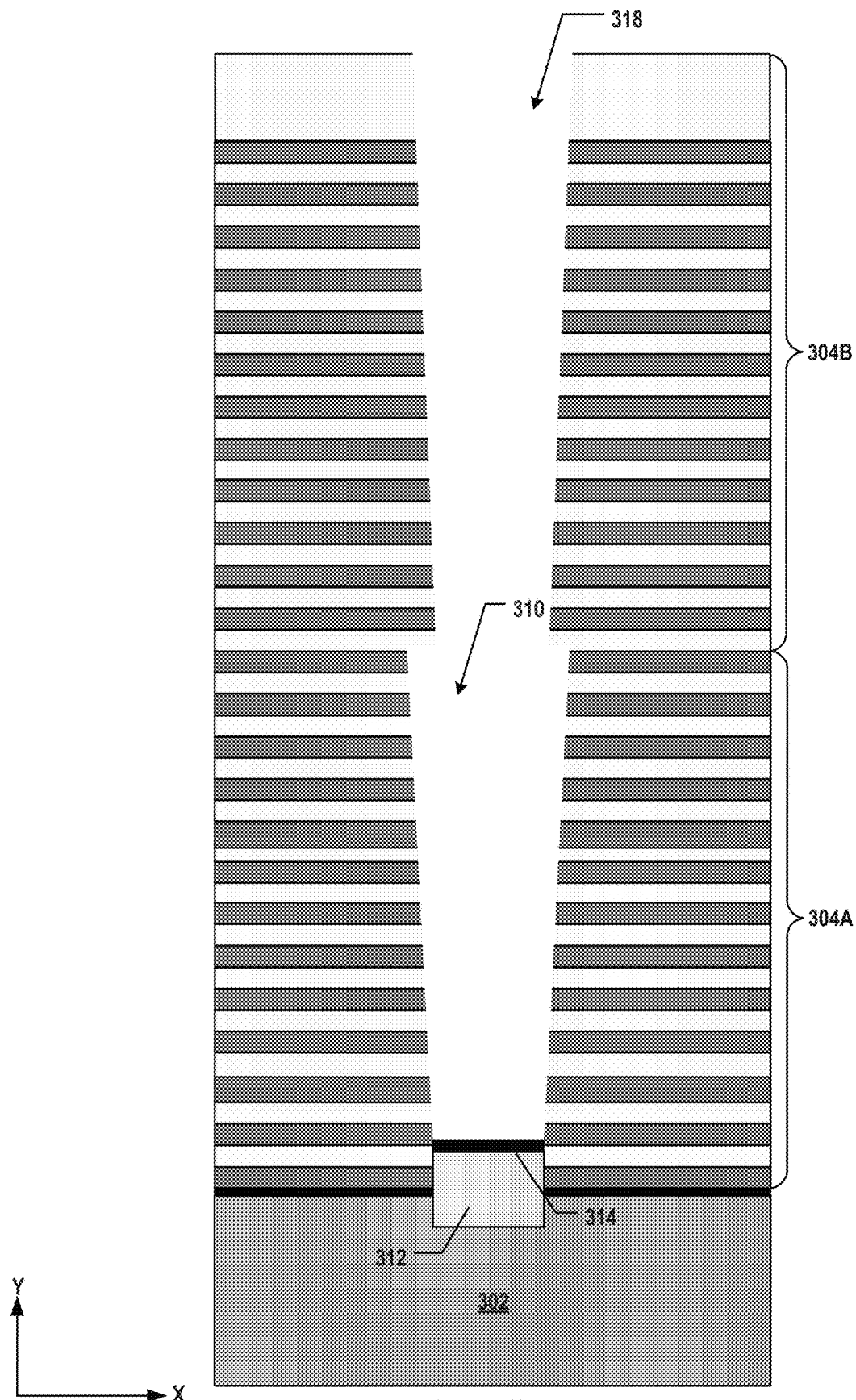

Method 400 proceeds to operation 416, as illustrated in FIG. 4B, in which the sacrificial layer is removed. In some embodiments, the sacrificial layer is etched until being stopped by the protective dielectric layer. As illustrated in FIG. 3F, sacrificial layer 316 (shown in FIG. 3E) is removed in lower dielectric deck 304A by wet etching and/or dry etching until being stopped by protective dielectric layer 314. In some embodiments, sacrificial layer 316 includes polysilicon, protective dielectric layer 314 includes silicon oxide (e.g., the native oxide layer of silicon plug 312), and sacrificial layer 316 is etched by tetramethylammonium hydroxide (TMAH) etchant, which can be stopped by silicon oxide of protective dielectric layer 314. Protective dielectric layer 314 with a sufficient thickness as described above can act as the etch stop layer to prevent damages to underneath silicon plug 312 and silicon substrate 302 caused by the etching of sacrificial layer 316. After the removal of sacrificial layer 316, lower channel hole 310 becomes open again and connected with upper channel hole 318, as shown in FIG. 3F.

Method 400 proceeds to operation 418, as illustrated in FIG. 4B, in which a memory film is formed on the protective dielectric layer and along sidewall of the first and second openings. In some embodiments, the memory film is first formed on the protective dielectric layer and along the sidewall of the first and second openings, and a channel sacrificial layer is formed over the memory film. In some embodiments, a first silicon oxide layer, a silicon nitride layer, a second silicon oxide layer, and a polysilicon layer are subsequently deposited on the sidewall of the first and second openings in this order to form the memory film and channel sacrificial layer.

Figure 3G:
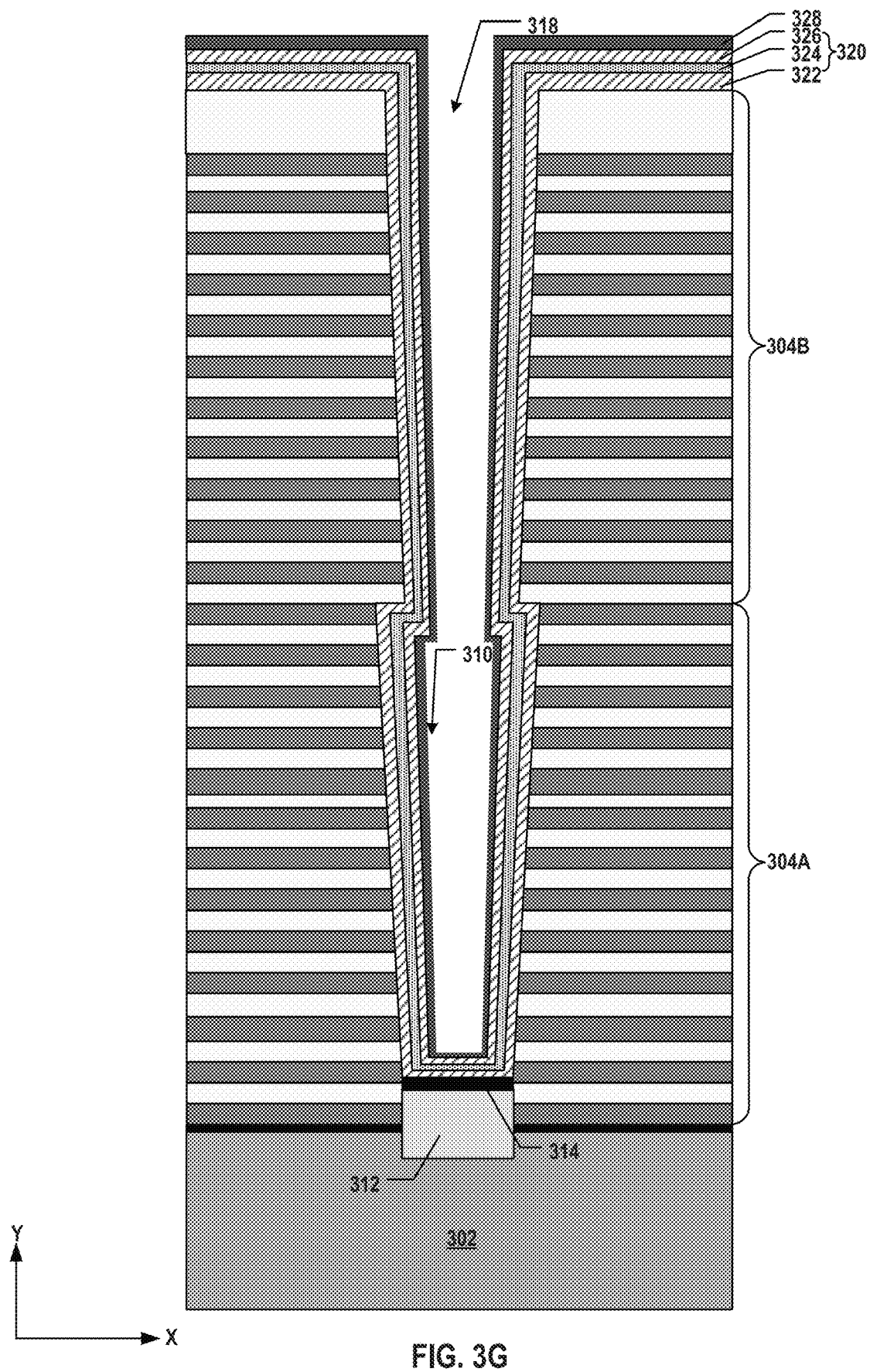

As illustrated in FIG. 3G, a memory film 320 (including a blocking layer 322, a storage layer 324, and a tunneling layer 326) and a channel sacrificial layer 328 are formed on protective dielectric layer 314 and along the sidewall of lower and upper channel holes 310 and 318. In some embodiments, memory film 320 is first deposited along the sidewall of lower and upper channel holes 310 and 318 and on protective dielectric layer 314, and channel sacrificial layer 328 is then deposited over memory film 320. Blocking layer 322, storage layer 324, and tunneling layer 326 can be subsequently deposited in this order using one or more thin film deposition processes, such as ALD, CVD, PVD, any other suitable processes, or any combination thereof, to form memory film 320. Channel sacrificial layer 328 can then be formed by depositing polysilicon or any other suitable sacrificial materials on tunneling layer 326 using one or more thin film deposition processes, such as ALD, CVD, PVD, any other suitable processes, or any combination thereof. As shown in FIG. 3G, memory film 320 and channel sacrificial layer 328 can cover both the bottom surface (on protective dielectric layer 314) and the sidewall of lower and upper channel holes 310 and 318. In some embodiments, a silicon oxide layer, a silicon nitride layer, a silicon oxide layer, and a polysilicon layer (an "SONO" structure) are subsequently deposited to form memory film 320 and channel sacrificial layer 328. Different from some 3D memory devices using an ALD liner oxide layer as the protective layer of the semiconductor plug, which is removed before the formation of the memory film and semiconductor channel, protective dielectric layer 314 of silicon plug 312 remains through all the later fabrication processes and in the resulting 3D memory device.

Figure 3H:
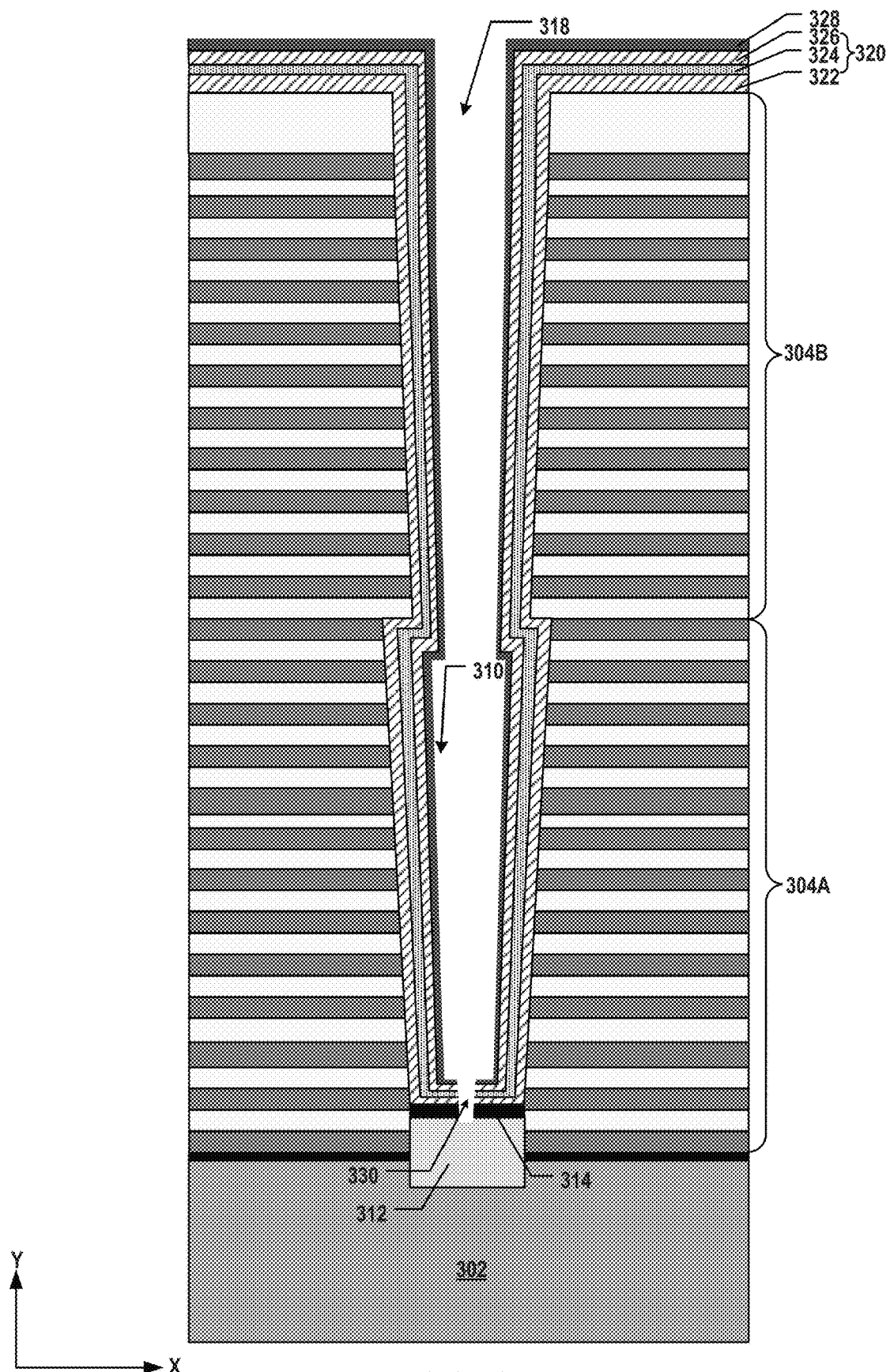

Method 400 proceeds to operation 420, as illustrated in FIG. 4B, in which a third opening through the memory film and the protective dielectric layer is formed in the lower portion of the first opening. As illustrated in FIG. 3H, a contact opening 330 is formed through channel sacrificial layer 328, memory film 320, and protective dielectric layer 314 to silicon plug 312 using multiple wet etching and/or dry etching processes. In some embodiments, when a "SONO" structure of s channel sacrificial layer 328 and memory film 320 is formed, a process known as "SONO punch" is used to etch through channel sacrificial layer 328 and memory film 320 at the bottom surface of lower channel hole 310, followed by another etching process to etch through protective dielectric layer 314 to reach silicon plug 312.

Figure 3I:
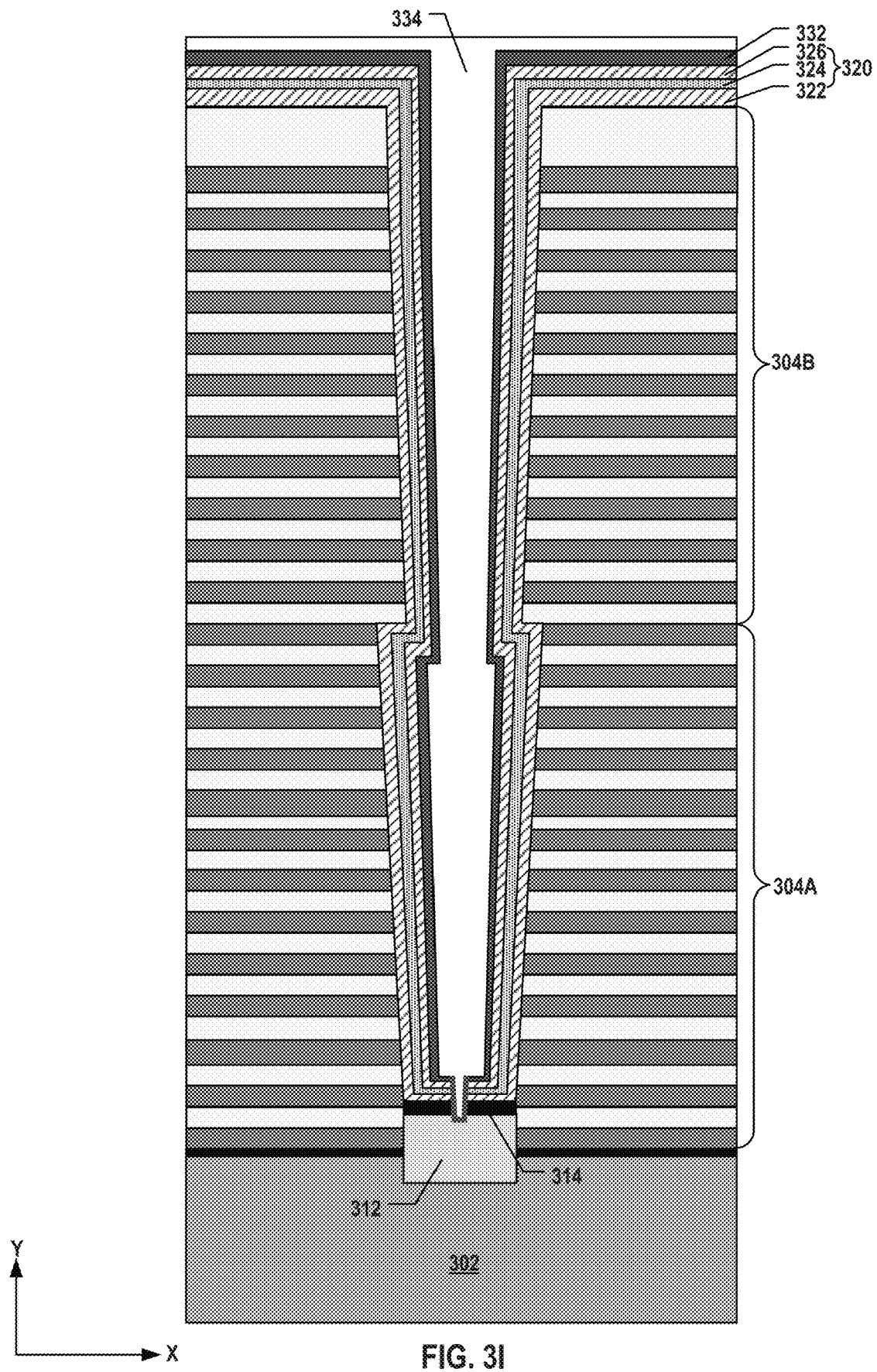

Method 400 proceeds to operation 422, as illustrated in FIG. 4B, in which a semiconductor channel is formed over the memory film and in the third opening to contact the semiconductor plug. In some embodiments, to form the semiconductor channel, a polysilicon layer is deposited over the second silicon oxide layer and in the third opening. In some embodiments, a filling layer is formed after the formation of the semiconductor channel to fill the first and second openings. As illustrated in FIG. 3I, channel sacrificial layer 328 (shown in FIG. 3H) is removed by wet etching and/or dry etching, and a semiconductor channel 332 is formed over tunneling layer 326 of memory film 320 and in contact opening 330 (shown in FIG. 3H) as well using one or more thin film deposition processes, such as CVD, PVD, ALD, electroplating, electroless plating, or any combination thereof, to contact silicon plug 312. In some embodiments, semiconductor channel 332 includes polysilicon. Semiconductor channel 332 can fully or partially fill contact opening 330 as long as it can contact silicon plug 312. For example, semiconductor channel 332 can be deposited on the sidewall of contact opening 330 without completely filling contact opening 330. As illustrated in FIG. 3I, a filling layer 334, such as a silicon oxide layer, is formed in lower and upper channel holes 310 and 318 (shown in FIG. 3H) to fully or partially fill the remaining space of lower and upper channel holes 310 and 318 using one or more thin film deposition processes, such as CVD, PVD, ALD, electroplating, electroless plating, or any combination thereof.

Figure 3J:
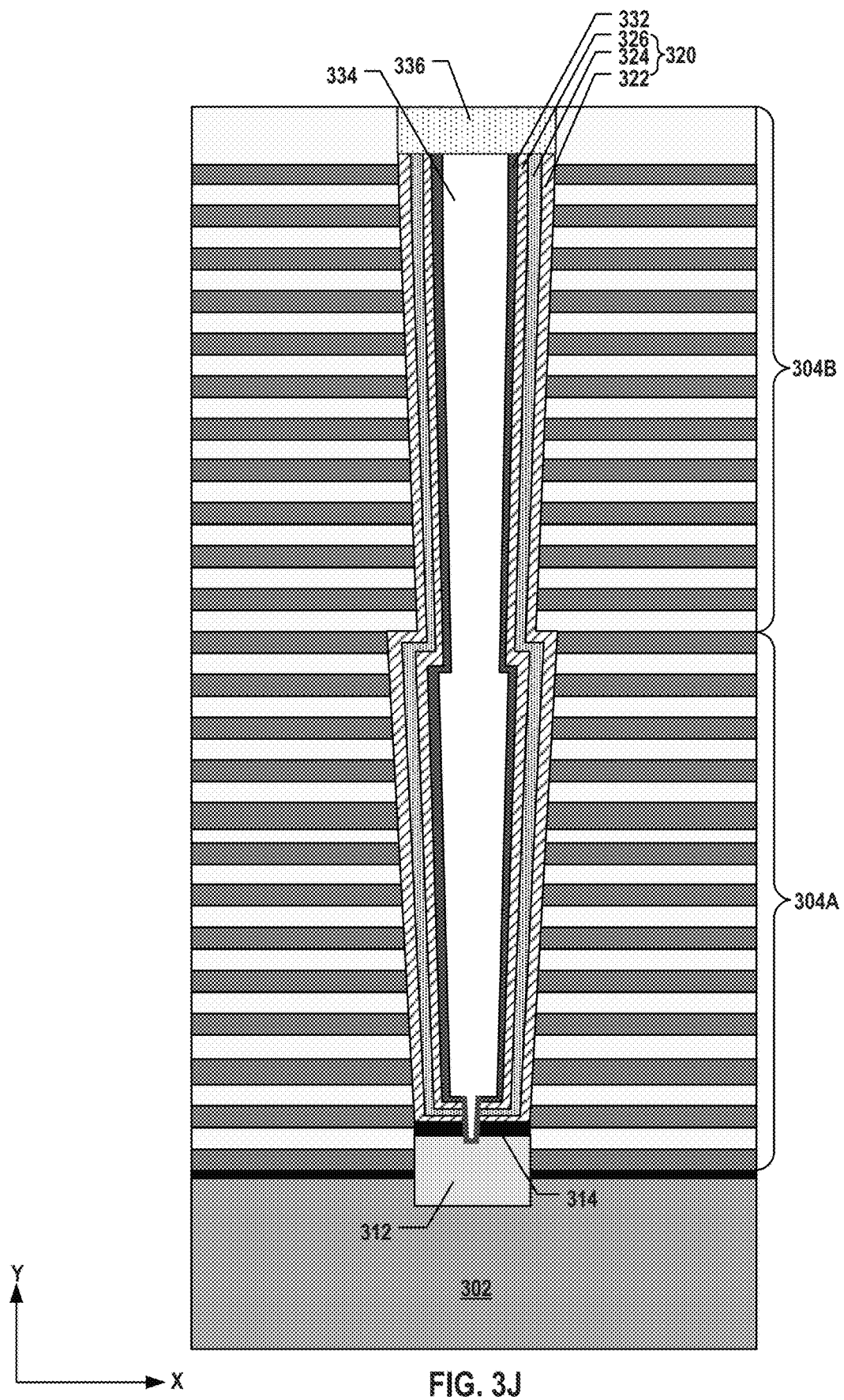

As illustrated in FIG. 3J, a channel plug 336 is formed in the upper portion of upper channel hole 318 (shown in FIG. 3H). In some embodiments, parts of memory film 320, semiconductor channel 332, and filling layer 334 that are on the top surface of upper dielectric deck 304B (shown in FIG. 3I) are removed and planarized by CMP, wet etching and/or dry etching. A recess then can be formed in the upper portion of upper channel hole 318 by wet etching and/or drying etching parts of memory film 320, semiconductor channel 332, and filling layer 334 in the upper portion of upper channel hole 318 (shown in FIG. 3I). Channel plug 336 then can be formed by depositing conductive materials, such as metals, into the recess by one or more thin film deposition processes, such as CVD, PVD, ALD, electroplating, electroless plating, or any combination thereof. A NAND memory sting is thereby formed.

Although not illustrated, it is understood that after the formation of the NAND memory string as shown in FIGS. 3A-3J, a dual-deck memory stack can be formed by replacing sacrificial layers 308 in lower and upper dielectric decks 304A and 304B with conductor layers. The memory stack thus can include a plurality of conductor/dielectric layer pairs. In some embodiments, to form the memory stack, a slit opening (e.g., a gate line slit) can be formed through lower and upper dielectric decks 304A and 304B, sacrificial layers 308 in lower and upper dielectric decks 304A and 304B can be etched by applying the etchants through the slit opening to form a plurality of lateral recesses, and the conductor layers can be deposited in the lateral recesses.

According to one aspect of the present disclosure, a 3D memory device includes a substrate, a memory stack including a plurality of interleaved conductor layers and dielectric layers on the substrate, and a memory string extending vertically through the memory stack. The memory string includes a semiconductor plug in a lower portion of the memory string, a protective dielectric layer on the semiconductor plug, and a memory film above the protective dielectric layer and along a sidewall of the memory string.

In some embodiments, the semiconductor plug is an epitaxially-grown silicon plug.

In some embodiments, the protective dielectric layer is a native oxide layer of the semiconductor plug. A thickness of the protective dielectric layer can be between about 1 nm and about 5 nm. In some embodiments, the protective dielectric layer is not disposed along the sidewall of the memory string. In some embodiments, the protective dielectric layer abuts the sidewall of the memory string.

In some embodiments, the protective dielectric layer includes an opening. The memory string includes a semiconductor channel along the sidewall of the memory string and that extends through the opening to contact the semiconductor plug, according to some embodiments.

In some embodiments, the memory film includes a blocking layer, a storage layer, and a tunneling layer.

According to another aspect of the present disclosure, a method for forming a 3D memory device is disclosed. A first dielectric deck including a first plurality of interleaved sacrificial layers and dielectric layers is formed on a substrate. A first opening extending vertically through the first dielectric deck is formed. A semiconductor plug is formed in a lower portion of the first opening. A protective dielectric layer is formed on the semiconductor plug. A sacrificial layer is formed on the protective dielectric layer in the first opening. A second dielectric deck including a second plurality of interleaved sacrificial layers and dielectric layers is formed on the first dielectric deck. A second opening extending vertically through the second dielectric deck is formed to expose the sacrificial layer in the first opening. The sacrificial layer in the first opening is removed. A memory film is formed on the protective dielectric layer and along sidewall of the first and second openings. A third opening is formed through the memory film and the protective dielectric layer in the lower portion of the first opening. A semiconductor channel is formed over the memory film and in the third opening to contact the semiconductor plug.

In some embodiments, to form the protective dielectric layer, a native oxide layer of the semiconductor plug is formed. In some embodiments, the native oxide layer is formed by thermal oxidation. In some embodiments, the native oxide layer is formed by wet chemical oxidation. A thickness of the protective dielectric layer can be between about 1 nm and about 5 nm. In some embodiments, the protective dielectric layer is not formed along the sidewall of the first opening. In some embodiments, the protective dielectric layer is formed to completely cover the semiconductor plug.

In some embodiments, to form the semiconductor plug, a silicon plug is epitaxially grown from the substrate.

In some embodiments, to remove the sacrificial layer, the sacrificial layer is etched until being stopped by the protective dielectric layer.

In some embodiments, to form the memory film, a first silicon oxide layer, a silicon nitride layer, and a second silicon oxide layer are subsequently deposited on the sidewall of the first and second openings in this order. In some embodiments, to form the semiconductor channel, a polysilicon layer is deposited over the second silicon oxide layer and in the third opening.

According to still another aspect of the present disclosure, a method for forming a 3D memory device is disclosed. A first dielectric deck including a first plurality of interleaved sacrificial layers and dielectric layers is formed on a substrate. A first opening extending vertically through the first dielectric deck is formed. A semiconductor plug is epitaxially grown from the substrate in a lower portion of the first opening. A top portion of the semiconductor plug is oxidized to form a native oxide layer. A sacrificial layer is formed on the native oxide layer in the first opening. A second dielectric deck including a second plurality of interleaved sacrificial layers and dielectric layers is formed on the first dielectric deck. A second opening extending vertically through the second dielectric deck is formed to expose the sacrificial layer in the first opening. The sacrificial layer is etched until being stopped by the native oxide layer.

In some embodiments, after etching the sacrificial layer, a memory film is formed on the native oxide layer and along sidewall of the first and second openings.

In some embodiments, a third opening is formed through the memory film and the native oxide layer in the lower portion of the first opening, and a semiconductor channel is formed over the memory film and in the third opening to contact the semiconductor plug.

In some embodiments, to form the memory film, a first silicon oxide layer, a silicon nitride layer, and a second silicon oxide layer are subsequently deposited on the sidewall of the first and second openings in this order. In some embodiments, to form the semiconductor channel, a polysilicon layer is deposited over the second silicon oxide layer and in the third opening In some embodiments, the native oxide layer is formed by thermal oxidation. In some embodiments, wherein the native oxide layer is formed by wet chemical oxidation. A thickness of the native oxide layer can be between about 1 nm and about 5 nm.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a memory stack comprising a plurality of interleaved conductor layers and dielectric layers on the substrate; and
   a memory string extending vertically through the memory stack and comprising:
      a semiconductor plug in a lower portion of the memory string;
      a protective dielectric layer directly on the semiconductor plug; and
      a memory film above the protective dielectric layer and along a sidewall of the memory string.

2. The 3D memory device of claim 1, wherein the protective dielectric layer is a native oxide layer of the semiconductor plug.

3. The 3D memory device of claim 1, wherein the semiconductor plug is an epitaxially-grown silicon plug.

4. The 3D memory device of claim 1, wherein a thickness of the protective dielectric layer is between about 1 nm and about 5 nm.

5. The 3D memory device of claim 1, wherein the protective dielectric layer is not disposed along the sidewall of the memory string.

6. The 3D memory device of claim 1, wherein the protective dielectric layer abuts the sidewall of the memory string.

7. A method for forming a three-dimensional (3D) memory device, comprising:
   forming a first dielectric deck comprising a first plurality of interleaved sacrificial layers and dielectric layers on a substrate;
   forming a first opening extending vertically through the first dielectric deck;
   forming a semiconductor plug in a lower portion of the first opening;
   forming a protective dielectric layer on the semiconductor plug;
   forming a sacrificial layer on the protective dielectric layer in the first opening;
   forming a second dielectric deck comprising a second plurality of interleaved sacrificial layers and dielectric layers on the first dielectric deck;
   forming a second opening extending vertically through the second dielectric deck to expose the sacrificial layer in the first opening;
   removing the sacrificial layer in the first opening;
   forming a memory film on the protective dielectric layer and along sidewalls of the first and second openings;
   forming a third opening through the memory film and the protective dielectric layer in the lower portion of the first opening; and
   forming a semiconductor channel over the memory film and in the third opening to contact the semiconductor plug.

8. The method of claim 7, wherein forming the protective dielectric layer comprises forming a native oxide layer of the semiconductor plug.

9. The method of claim 8, wherein the native oxide layer is formed by thermal oxidation.

10. The method of claim 8, wherein the native oxide layer is formed by wet chemical oxidation.

11. The method of claim 7, wherein forming the semiconductor plug comprises epitaxially growing a silicon plug from the substrate.

12. The method of claim 7, wherein a thickness of the protective dielectric layer is between about 1 nm and about 5 nm.

13. The method of claim 7, wherein the dielectric layer is not formed along the sidewall of the first opening.

14. The method of claim 7, wherein the protective dielectric layer is formed to completely cover the semiconductor plug.

15. The method of claim 7, wherein removing the sacrificial layer comprises etching the sacrificial layer until being stopped by the protective dielectric layer.

16. The method of claim 7, wherein
forming the memory film comprises subsequently depositing a first silicon oxide layer, a silicon nitride layer, and a second silicon oxide layer on the sidewall of the first and second openings in this order; and
forming the semiconductor channel comprises depositing a polysilicon layer over the second silicon oxide layer and in the third opening.

17. A method for forming a three-dimensional (3D) memory device, comprising:
forming a first dielectric deck comprising a first plurality of interleaved sacrificial layers and dielectric layers on a substrate;
forming a first opening extending vertically through the first dielectric deck;
epitaxially growing a semiconductor plug from the substrate in a lower portion of the first opening;
oxidizing a top portion of the semiconductor plug to form a protective dielectric layer comprising a native oxide layer;
forming a sacrificial layer on the native oxide layer in the first opening;
forming a second dielectric deck comprising a second plurality of interleaved sacrificial layers and dielectric layers on the first dielectric deck;
forming a second opening extending vertically through the second dielectric deck to expose the sacrificial layer in the first opening; and
etching the sacrificial layer until being stopped by the native oxide layer.

18. The method of claim 17, wherein the native oxide layer is formed by thermal oxidation.

19. The method of claim 17, wherein the native oxide layer is formed by wet chemical oxidation.

20. The method of claim 17, wherein a thickness of the native oxide layer is between about 1 nm and about 5 nm.

\* \* \* \* \*